(12) United States Patent
Kim et al.

(10) Patent No.: US 11,189,503 B2
(45) Date of Patent: Nov. 30, 2021

(54) SUBSTRATE DRYING METHOD, PHOTORESIST DEVELOPING METHOD, PHOTOLITHOGRAPHY METHOD INCLUDING THE SAME, AND SUBSTRATE DRYING SYSTEM

(71) Applicant: Samsung Electronics Co., Ltd., Suwon-si (KR)

(72) Inventors: Young-Hoo Kim, Yongin-si (KR); Kuntack Lee, Suwon-si (KR); Yong-Jhin Cho, Hwaseong-si (KR); Chawon Koh, Yongin-si (KR); Sunghyun Park, Daegu (KR); Hyosan Lee, Hwaseong-si (KR); Ji Hoon Cha, Seoul (KR); Soo Young Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 16/420,776

(22) Filed: May 23, 2019

(65) Prior Publication Data

US 2020/0152486 A1    May 14, 2020

(30) Foreign Application Priority Data

Nov. 14, 2018    (KR) .......................... 10-2018-0139730

(51) Int. Cl.
*H01L 21/67*    (2006.01)
*H01L 21/02*    (2006.01)

(52) U.S. Cl.
CPC .. *H01L 21/67034* (2013.01); *H01L 21/02101* (2013.01); *H01L 21/02118* (2013.01)

(58) Field of Classification Search
CPC ......... H01L 21/67034; H01L 21/02101; H01L 21/02118
See application file for complete search history.

(56) References Cited

U.S. PATENT DOCUMENTS

| | | | |
|---|---|---|---|
| 6,334,266 B1* | 1/2002 | Moritz | B01J 3/008 118/725 |
| 6,576,066 B1* | 6/2003 | Namatsu | F26B 5/005 134/11 |
| 8,961,701 B2* | 2/2015 | Wagner | H01L 21/02057 134/25.4 |
| 2014/0101964 A1* | 4/2014 | Sirard | H01L 21/67034 34/284 |
| 2016/0109805 A1* | 4/2016 | Matsuura | G03F 7/0382 430/325 |

(Continued)

FOREIGN PATENT DOCUMENTS

| | | |
|---|---|---|
| JP | 2003-502135 A | 1/2003 |
| JP | 2003-337406 A | 11/2003 |

(Continued)

*Primary Examiner* — Nathan T Leong

(74) *Attorney, Agent, or Firm* — Harness, Dickey & Pierce, P.L.C.

(57) ABSTRACT

Disclosed are substrate drying methods, photoresist developing methods, and/or photolithography methods. The substrate drying method including providing a drying liquid on a substrate, increasing a pressure of the drying liquid to produce a supercritical fluid, and removing the supercritical fluid to dry the substrate may be provided.

17 Claims, 19 Drawing Sheets

(56) References Cited

U.S. PATENT DOCUMENTS

2017/0098541 A1* 4/2017 Gouk .................. F26B 21/14
2017/0108781 A1* 4/2017 Van Beuzekom .........................
H01L 21/67207

FOREIGN PATENT DOCUMENTS

| JP | 2005-20011 A | 1/2005 |
| JP | 4042412 B2 | 2/2008 |
| KR | 10-1329317 B1 | 11/2013 |

* cited by examiner

SUBSTRATE DRYING METHOD, PHOTORESIST DEVELOPING METHOD, PHOTOLITHOGRAPHY METHOD INCLUDING THE SAME, AND SUBSTRATE DRYING SYSTEM

CROSS-REFERENCE TO RELATED APPLICATIONS

This U.S. non-provisional patent application claims priority under 35 U.S.C. § 119 to Korean Patent Application No. 10-2018-0139730, filed on Nov. 14, 2018, in the Korean Intellectual Property Office, the entire contents of which are hereby incorporated by reference.

BACKGROUND OF THE INVENTION

The present disclosure relates to methods of and/or systems for fabricating a semiconductor device, and in particular, to methods of drying a substrate, methods of developing a photoresist layer, photolithography methods, and/or systems for drying a substrate.

To increase an integration density of a semiconductor device, many researches are conducted to realize an advanced photolithography method, called "a photo process." The photolithography method is a method of forming a photoresist pattern on a substrate or a target layer, before an etching process or an ion implantation process. For example, the photolithography method includes a photoresist forming process, an exposure process, and a developing process. In the exposure process, a photoresist layer is irradiated with an incident light, which is provided through a photomask. A wavelength of the incident light used for the exposure process determines a critical dimension (CD) of a fine pattern. The developing process is classified into a positive tone development process of removing a portion of the photoresist, which is exposed to the incident light, and a negative tone development process of removing a portion of the photoresist, which is not exposed to the incident light.

SUMMARY

Some example embodiments of the inventive concepts provide substrate drying methods capable of reducing or preventing leaning defects of a photoresist pattern, photoresist developing methods, and/or a photolithography methods including the methods.

According to an example embodiment of the inventive concepts, a substrate drying method may include providing a drying liquid on a substrate, increasing a pressure of the drying liquid to produce a supercritical fluid, and removing the supercritical fluid to dry the substrate.

According to an example embodiment of the inventive concepts, a developing method may include providing a developing solution on a substrate, providing a rinse solution on the substrate to remove the developing solution, and drying the substrate by removing the rinse solution. The drying the substrate may include providing a drying liquid on the substrate, increasing a pressure of the drying liquid to produce a supercritical fluid, and removing the supercritical fluid to dry the substrate.

According to an example embodiment of the inventive concepts, a photolithography method may include forming a photoresist on a substrate, exposing a portion of the photoresist to light, and developing the photoresist to form a photoresist pattern on the substrate. The developing the photoresist may include providing a developing solution on the substrate, providing a rinse solution on the substrate to remove the developing solution, and drying the substrate by removing the rinse solution. The drying the substrate may include providing a drying liquid on the substrate, increasing a pressure of the drying liquid to produce a supercritical fluid, and removing the supercritical fluid to dry the substrate.

According to an example embodiment of the inventive concepts, a substrate drying system may include a chamber, a cassette in the chamber and configured to contain a substrate, a first solution supplier configured to supply a wetting liquid into the chamber, a second solution supplier configured to supply a drying liquid, whose density is lower than a density of the wetting liquid into the chamber, and an exhaust connected to a bottom portion of the chamber and configured to selectively exhaust the wetting liquid.

According to an example embodiment of the inventive concepts, a substrate drying system may include a chamber, a cassette in the chamber and configured to contain a substrate, and a first solution supplier connected to the chamber and configured to supply a drying liquid into the chamber. The first solution supplier may include a pump configured to increase a pressure of the drying liquid and change the drying liquid to a supercritical fluid.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
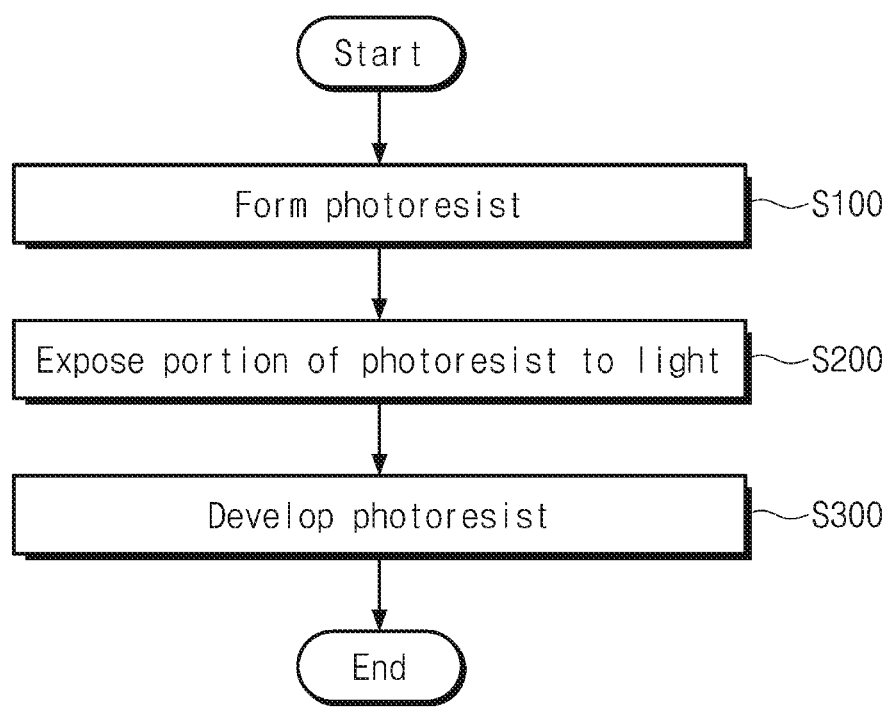
FIG. 1 is a flow chart illustrating a photolithography method according to an example embodiment of the inventive concepts.

FIG. 1 illustrates a photolithography method according to an example embodiment of the inventive concepts.

Referring to FIG. 1, a photolithography method according to an example embodiment of the inventive concepts may be used to form a photoresist pattern. In an example embodiment, the photolithography method may include forming a photoresist (in S100), exposing a portion of the photoresist to light (in S200), and developing the photoresist (in S300).

FIGS. 2 to 6 are cross-sectional views illustrating the photolithography method of FIG. 1.

Figure 2:
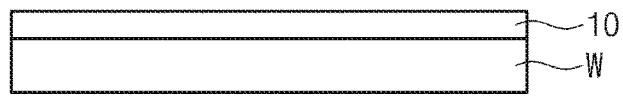
FIGS. 2 to 6 are cross-sectional views illustrating the photolithography method of FIG. 1.

Referring to FIGS. 1 and 2, a photoresist 10 may be formed on a substrate W (in S100). The photoresist 10 may be formed on the substrate W using a spin coating method, but the inventive concepts are not limited to this example. The photoresist 10 may be classified into a positive-type photoresist and a negative-type photoresist, based on the kind of its light-sensitive material.

Figure 3:
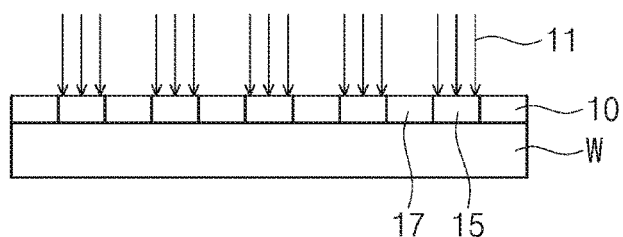

Referring to FIGS. 1 and 3, a portion of the photoresist 10 may be exposed to light 11 (in S200). In an example embodiment, the light 11 may include Extreme Ultraviolet (EUV) light. In an example embodiment, the light 11 may include an ArF or KrF excimer laser light, but the inventive concepts are not limited to these examples. The photoresist 10 may have an exposure region 15 and a non-exposure region 17. The exposure region 15 may be a region exposed to the light 11, and the non-exposure region 17 may be another region, which is not exposed to the light 11. In a developing process, the photoresist 10 may be developed to form a photoresist pattern, from which one of the exposure region 15 and the non-exposure region 17 is selectively removed, and the removal region may be determined by the kind of the photoresist 10. For example, in the case where the photoresist 10 is a positive-type photoresist, the exposure region 15 may be removed, and the non-exposure region 17 may be used as a photoresist pattern 12. By contrast, in the case where the photoresist 10 is a negative-type photoresist, the non-exposure region 17 may be removed, and the exposure region 15 may be used as the photoresist pattern 12.

Hereinafter, a developing method, which is performed on the positive-type photoresist 10, will be described.

Referring to FIGS. 1 and 4 to 6, the photoresist 10 may be developed to form the photoresist pattern 12 (in S300).

Figure 7:
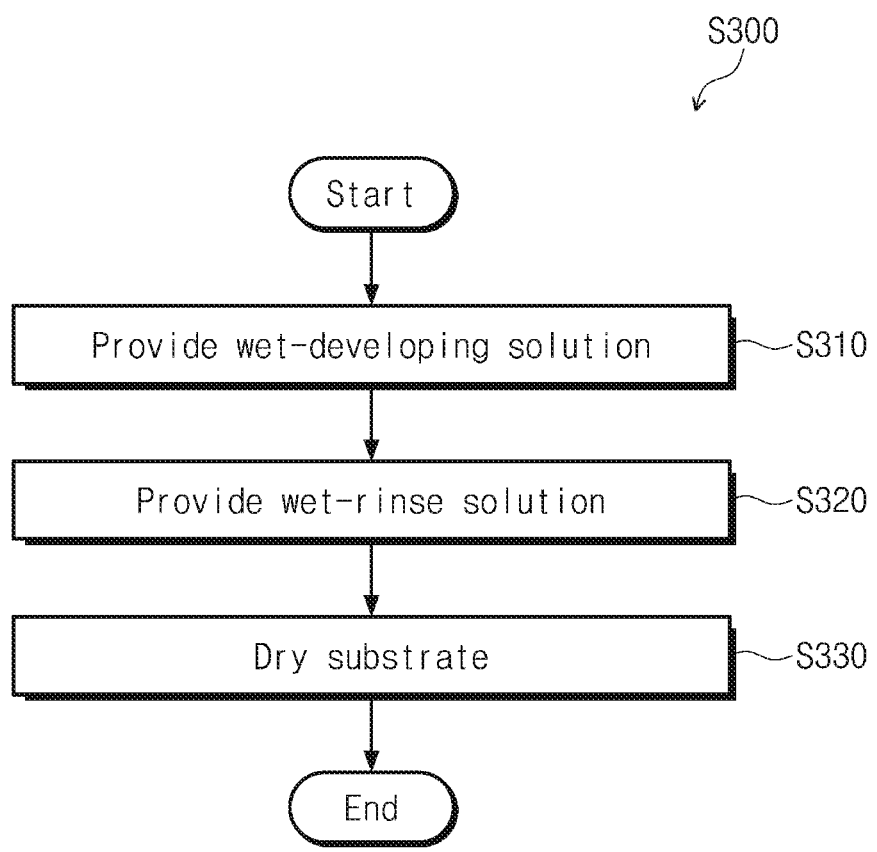
FIG. 7 is a flow chart illustrating an example of a photoresist developing operation in FIG. 3.

FIG. 7 illustrates an example of the photoresist developing operation (in S300) in FIG. 3.

In the case where the photoresist 10 is a positive-type photoresist, the developing operation (in S300) may include a positive tone development (PTD) process. As an example, the developing operation (in S300) may include providing a wet-developing solution 14 (in S310), providing a wet-rinse solution 16 (in S320), drying the substrate W (in S330).

Figure 4:
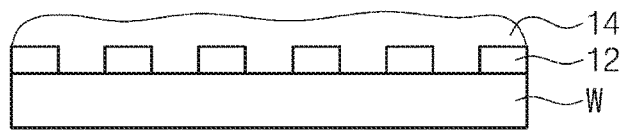

Referring to FIGS. 4 and 7, the wet-developing solution 14 may be provided on the photoresist 10 (in S310). The wet-developing solution 14 may be used to remove the exposure region 15 from the photoresist 10, and as a result, the non-exposure region 17 may form the photoresist pattern 12. The wet-developing solution 14 may include a base material of aqueous solution and may have a hydrophilic property. For example, the wet-developing solution 14 may include TetraMethyl-Ammonium-Hydroxide (TMAH), but the inventive concepts are not limited to this example.

Figure 5:
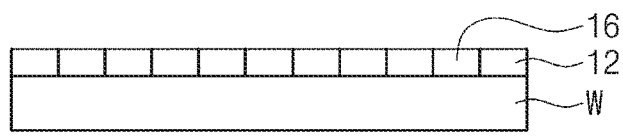

Referring to FIGS. 5 and 7, the wet-rinse solution 16 may be provided on the photoresist pattern 12 and the substrate W to remove the wet-developing solution 14 (in S320). The wet-rinse solution 16 may include deionized (DI) water.

Figure 6:
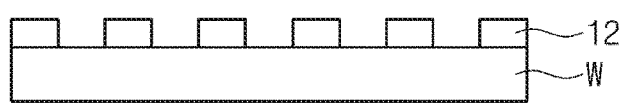

Referring to FIGS. 6 and 7, the wet-rinse solution 16 may be removed to allow the substrate W to be in a dried state (in S330). In the case where the wet-rinse solution 16 is dried in an atmospheric environment, the photoresist pattern 12 may be leaned or collapsed due to the surface tension of the wet-rinse solution 16. According to an example embodiment of the inventive concepts, the wet-rinse solution 16 may be replaced with a supercritical fluid, whose surface tension is zero, and this may make it possible to reduce or prevent the leaning or collapsing issue of the photoresist pattern 12.

Hereinafter, a method of drying the substrate W using the supercritical fluid will be described.

Figure 8:
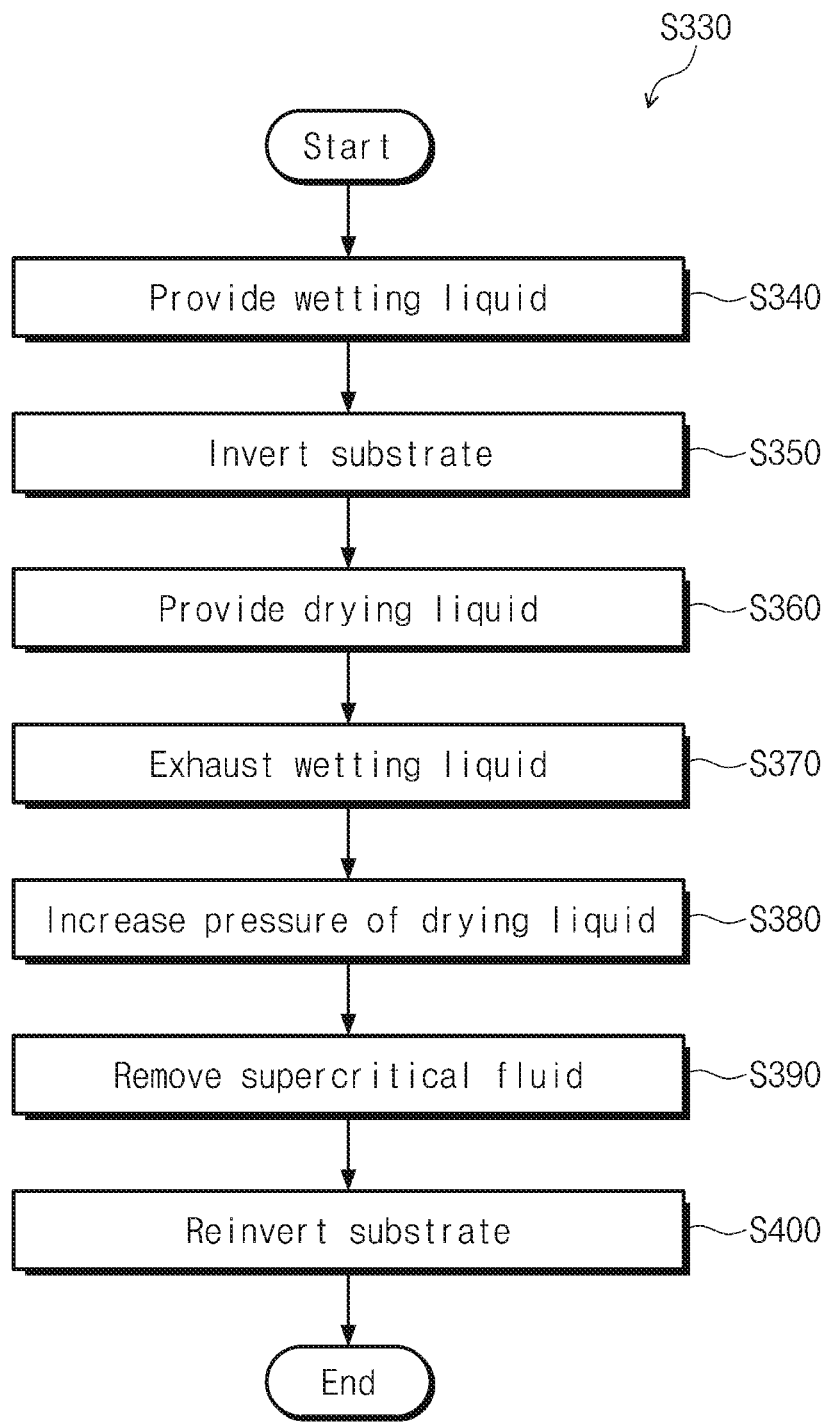
FIG. 8 is a flow chart illustrating an example of a substrate drying operation in FIG. 7.

FIG. 8 illustrates an example of the substrate drying operation (in S330) of FIG. 7.

Referring to FIG. 8, the substrate drying operation (in S330) may include a plurality of sub-operations, which include providing a wetting liquid (in S340), inverting the substrate W (in S350), providing a drying liquid (in S360), exhausting the wetting liquid (in S370), increasing a pressure or temperature of the drying liquid to convert the drying liquid into a supercritical fluid (in S380), removing the supercritical fluid (in S390), and reinverting the substrate W (in S400).

FIGS. 9 to 15 are diagrams illustrating a substrate drying system 100 and operations thereof, according to an example embodiment of the inventive concepts.

Referring to FIGS. 9 to 15, the substrate drying system 100 may include a chamber 110, a cassette 120, a first solution supplier 130, a second solution supplier 140, a gas supplier 150, an agitator 160, and an exhaust 170. The chamber 110 may provide a space, which is isolated from the outer space, and configured to accommodate the substrate W therein. The cassette 120 may be disposed in the chamber 110 and configured to contain the substrate W. The cassette 120 may be configured to invert the substrate W. The first solution supplier 130 may supply a wetting liquid 132 into the chamber 110. The second solution supplier 140 may supply a drying liquid 142 into the chamber 110. In an example embodiment, the second solution supplier 140 may include a drying liquid tank 146, a valve 148, and a pump 149. The drying liquid tank 146 may store the drying liquid 142. The valve 148 and the pump 149 may be disposed in between the drying liquid tank 146 and the chamber 110, and may connected in parallel between the drying liquid tank 146 and the chamber 110. The valve 148 may control a flow rate of the drying liquid 142. The pump 149 may control a pressure of the drying liquid 142. The gas supplier 150 may supply a drying gas 152 into the chamber 110. The agitator 160 may be disposed in a lower portion of the chamber 110. The agitator 160 may be configured to stir the drying liquid 142. The exhaust 170 may be connected to a bottom of the chamber 110. The exhaust 170 may include a plurality of valves, which are connected in series, and may buffer a change in pressure of the chamber 110. The exhaust 170 may be configured to exhaust or outgas the wetting liquid 132, the drying liquid 142, a supercritical fluid 144, and/or the drying gas 152 from the chamber 110.

Figure 9:
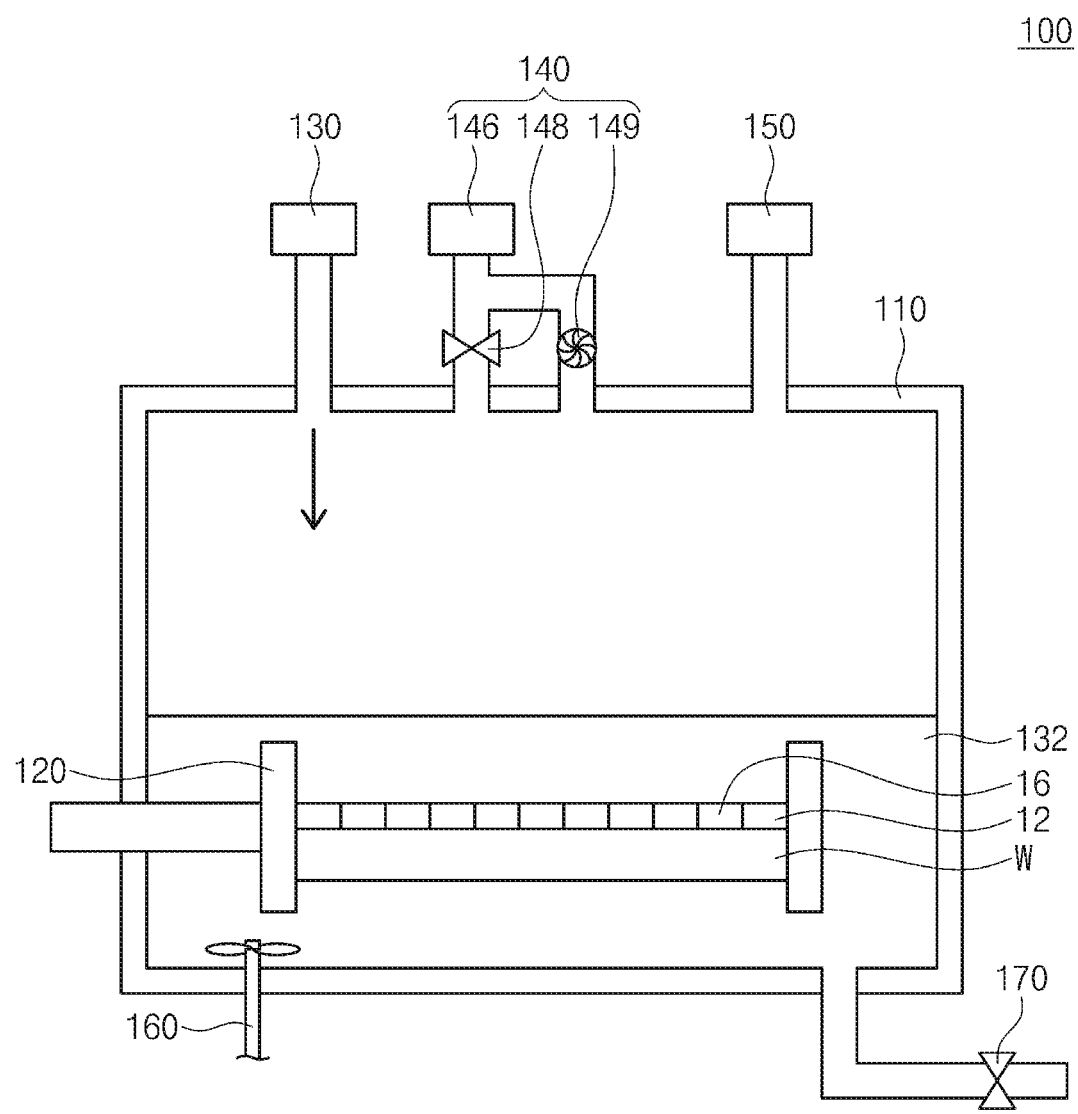
FIGS. 9 to 15 are diagrams illustrating a substrate drying system and operations thereof, according to an example embodiment of the inventive concepts.

Referring to FIGS. 8 and 9, the first solution supplier 130 may provide the wetting liquid 132 onto the substrate W (in S340). The substrate W may be dipped into the wetting liquid 132. In an example embodiment, the wetting liquid 132 may be the same material as the wet-rinse solution 16. For example, the wetting liquid 132 may include deionized water. The wetting liquid 132 may be mixed with the wet-rinse solution 16.

Figure 10:
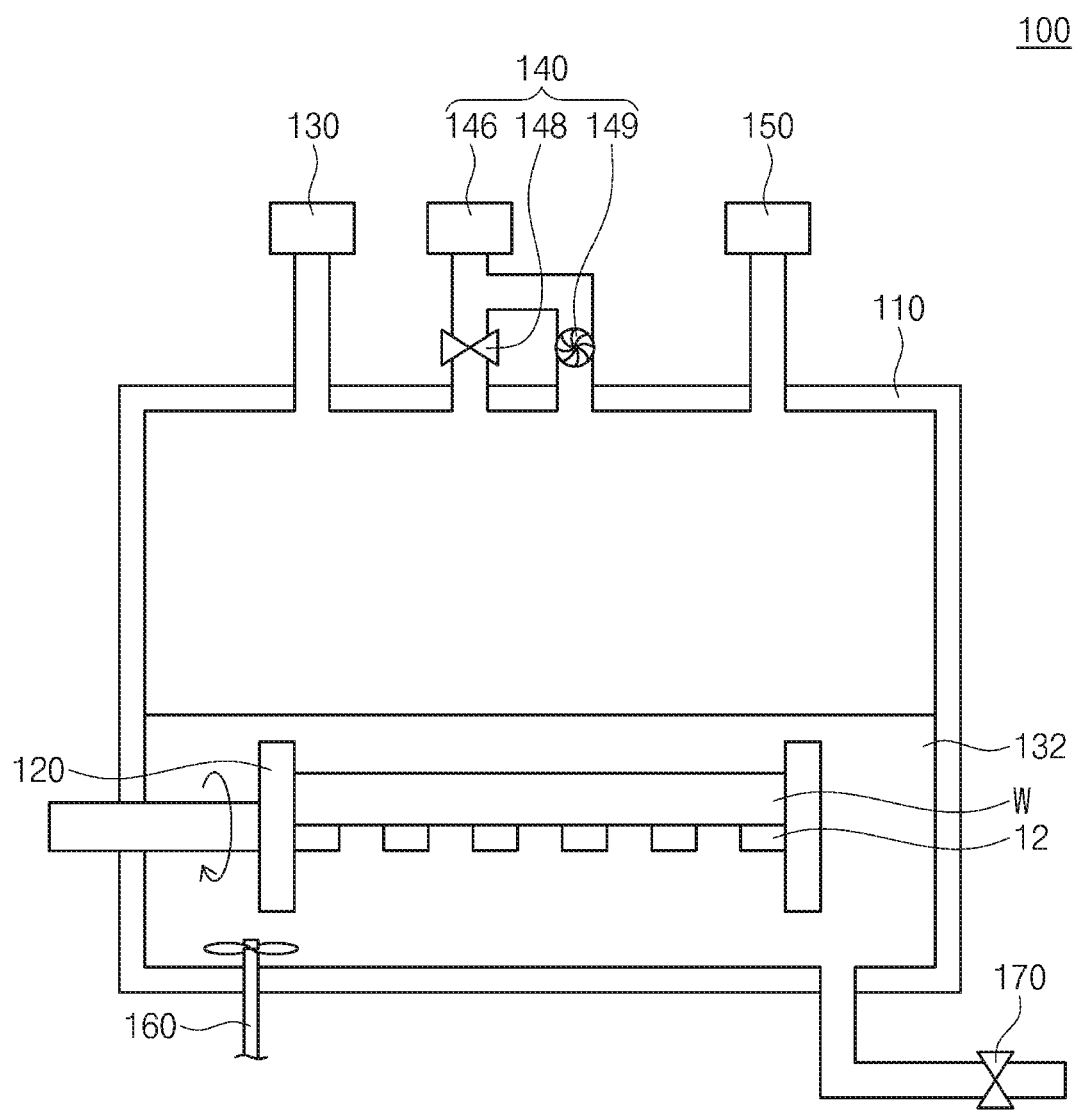

Referring to FIGS. 8 and 10, the cassette 120 may invert the substrate W (in S350). The substrate W may be inverted in the wetting liquid 132.

Although not shown, an organic solvent (not shown) may be provided on the substrate W and the photoresist pattern 12. In the case where the organic solvent is provided on the substrate W and the photoresist pattern 12, the operation S340 of providing the wetting liquid 132 and the operation S350 of inverting the substrate W may be omitted.

Figure 11:
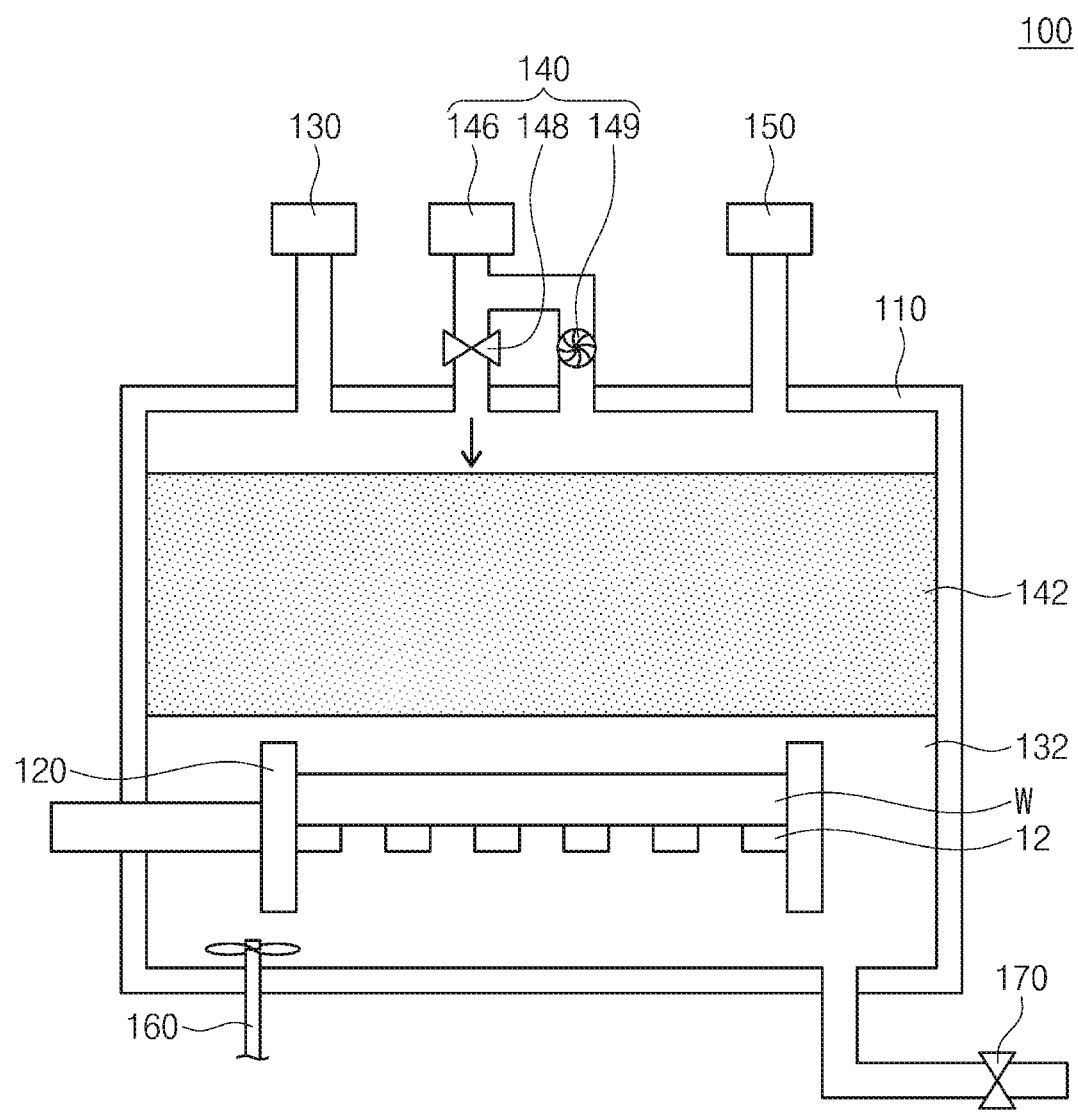

Referring to FIGS. 8 and 11, the second solution supplier 140 may provide the drying liquid 142 on the substrate W (in S360). The drying liquid 142 may be provided into the chamber 110 through the valve 148. The temperature of the drying liquid 142 may range from about 0° C. to about 35° C. For example, the temperature of the drying liquid 142 may be a room temperature (e.g., 20° C.). Thus, the wetting liquid 132 may not be frozen. As an example, the drying liquid 142 may have a density that is lower than that of each of the wetting liquid 132 and the wet-rinse solution 16. Due to the difference in density therebetween, the wetting liquid 132 and the drying liquid 142 may be vertically separated from each other, in the chamber 110. For example, the wetting liquid 132 may be positioned below the drying liquid 142. The drying liquid 142 may be water-free liquid. The drying liquid 142 may be formed of or include liquid carbon dioxide. The drying liquid 142 may have a pressure higher than an atmospheric pressure. For example, the drying liquid 142 may have a pressure ranging from about 5 bar to about 74.8 bar.

Although not shown, in the case where an organic solvent is provided on the substrate W and the photoresist pattern 12, the drying liquid 142 may be easily mixed with the organic solvent. Thus, the organic solvent may be removed by the drying liquid 142 between the photoresist patterns 12.

Figure 12:
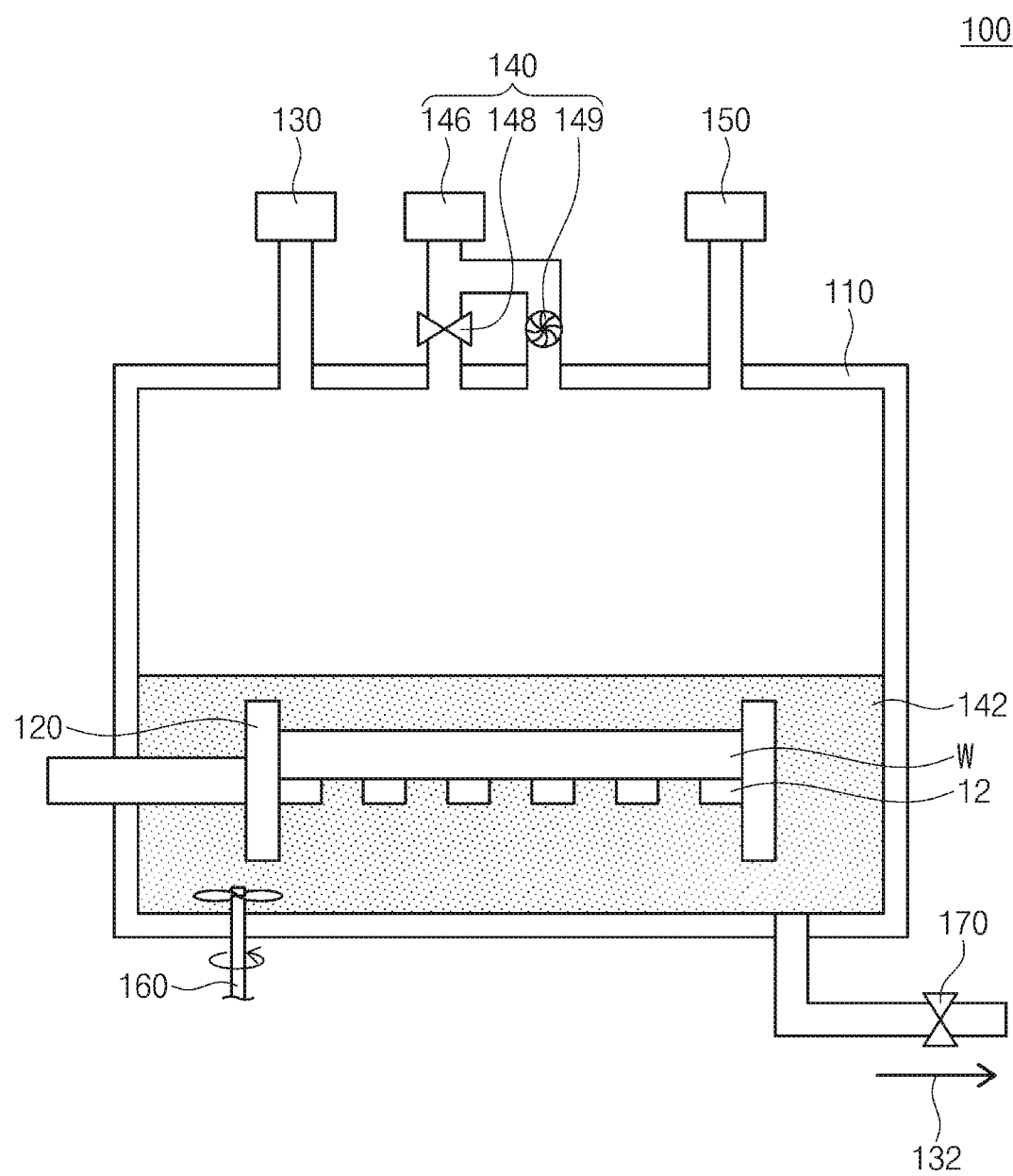

Referring to FIGS. 8 and 12, the exhaust 170 may be configured to exhaust or drain the wetting liquid 132 (in S370). The wetting liquid 132 may be selectively exhausted, without exhausting of the drying liquid 142. The exhaust 170 may exhaust not only the wetting liquid 132 but also exhaust any remaining portion of the wet-rinse solution 16. Because the wet-rinse solution 16 and the photoresist pattern 12 on the substrate W face down, the wet-rinse solution 16 may be easily exhausted through the exhaust 170, without being interrupted by the substrate W. Thus, the drying liquid 142 may be pulled down such that the substrate W in immersed in the drying liquid 142. The agitator 160 may stir the drying liquid 142 to facilitate removal of the wetting liquid 132 or the wet-rinse solution 16 on the substrate W or the photoresist pattern 12. In an example embodiment, the agitator 160 may be configured to provide a sonic wave to the drying liquid 142.

Although not shown, in the case where an organic solvent is provided on the substrate W and the photoresist pattern 12, the exhausting of the wetting liquid 132 (in S370) may be omitted.

Figure 13:
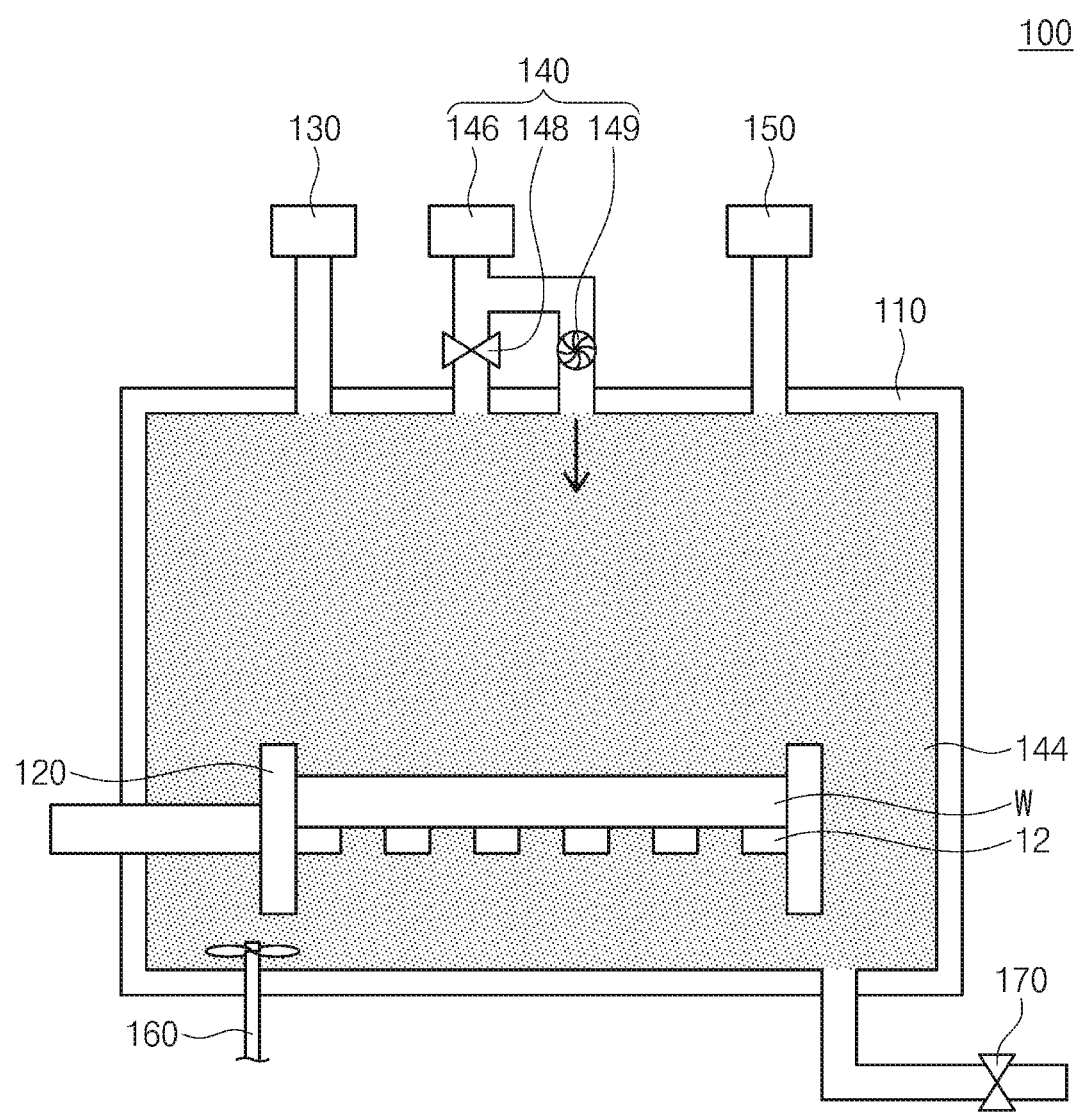
Figure 14:
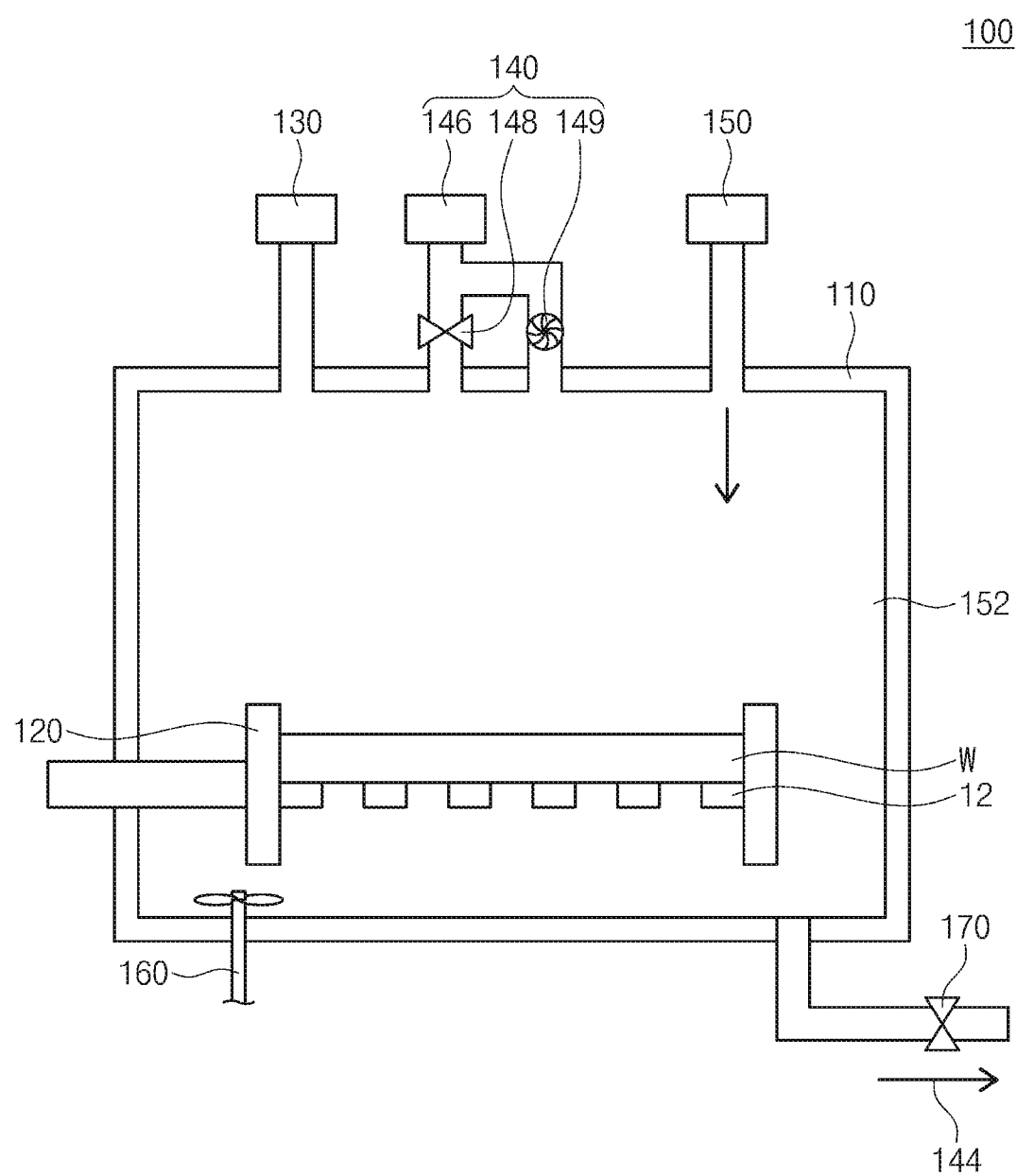

Referring to FIGS. 8 and 13, the pump 149 may increase a pressure of the drying liquid 142 to produce a supercritical fluid 144 (in S380). For example, the pump 149 may increase the pressure of the drying liquid 142 to a pressure that is higher than that of a critical point of the supercritical fluid 144. The drying liquid tank 146 and the pump 149 may be used as a supercritical fluid supplying device.

Figure 16:
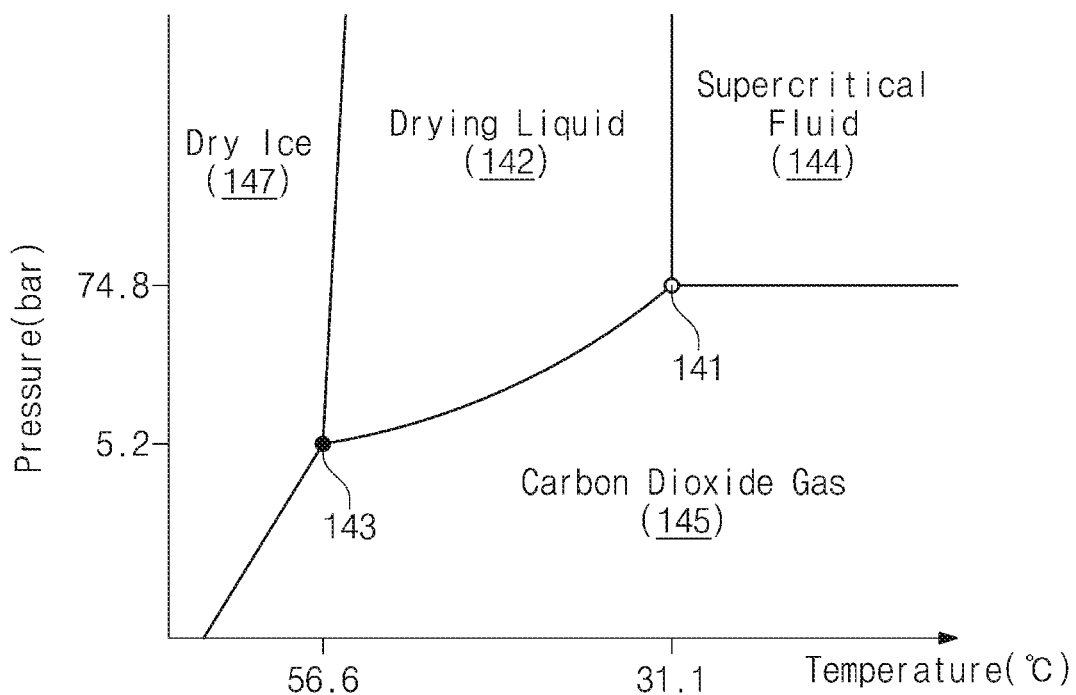
FIG. 16 is a pressure-temperature phase diagram of a drying liquid of FIG. 12.

FIG. 16 is a pressure-temperature phase diagram of the drying liquid 142 of FIG. 12.

Referring to FIG. 16, in the case where the drying liquid 142 is liquid carbon dioxide, the supercritical fluid 144 may have a critical point 141 at a pressure of about 74.8 bar and at temperature of about 31.1° C. In the case where the pressure and the temperature of the drying liquid 142 are increased to be higher than the critical point 141, the drying liquid 142 may be changed to the supercritical fluid 144. The surface tension of the supercritical fluid 144 may be substantially zero. If the pressure and temperature are decreased below those of the critical point 141, the supercritical fluid 144 may be changed to the drying liquid 142 or a carbon dioxide gas 145.

The pressure and temperature of the drying liquid 142 may be higher than those of a triple point 143. For example, the pressure and temperature of the triple point may be about 5.2 bar and −56.6° C., respectively. At a pressure and a temperature lower than those of the triple point, the drying liquid 142 may be changed to the carbon dioxide gas 145 or a dry ice 147.

Although not shown, the substrate drying system 100 according to an example embodiment of the inventive concepts may include a supercritical fluid supplier (not shown), which is independent of the second solution supplier 140. The supercritical fluid supplier may supply the supercritical fluid 144 into the chamber 110. If the supercritical fluid 144 is supplied into the chamber 110, the drying liquid 142 in the chamber 110 may have an increased pressure, and thus may be changed to the supercritical fluid 144.

Referring back to FIGS. 8 and 14, the exhaust 170 may exhaust the supercritical fluid 144 to the outside of the chamber 110 (in S390). Because the surface tension of the exhausted supercritical fluid 144 is substantially zero, it may be possible to reduce or prevent leaning defects of the photoresist pattern 12. The supercritical fluid 144 may be changed to a residual gas in the chamber. The exhaust 170 may exhaust the residual gas to the outside of the chamber 110. Further, the gas supplier 150 may supply the drying gas 152 into the chamber 110 to exhaust or outgas the supercritical fluid 144 or the residual gas from the chamber 110. The drying gas 152 may include a carbon dioxide ($CO_2$) gas.

Figure 15:
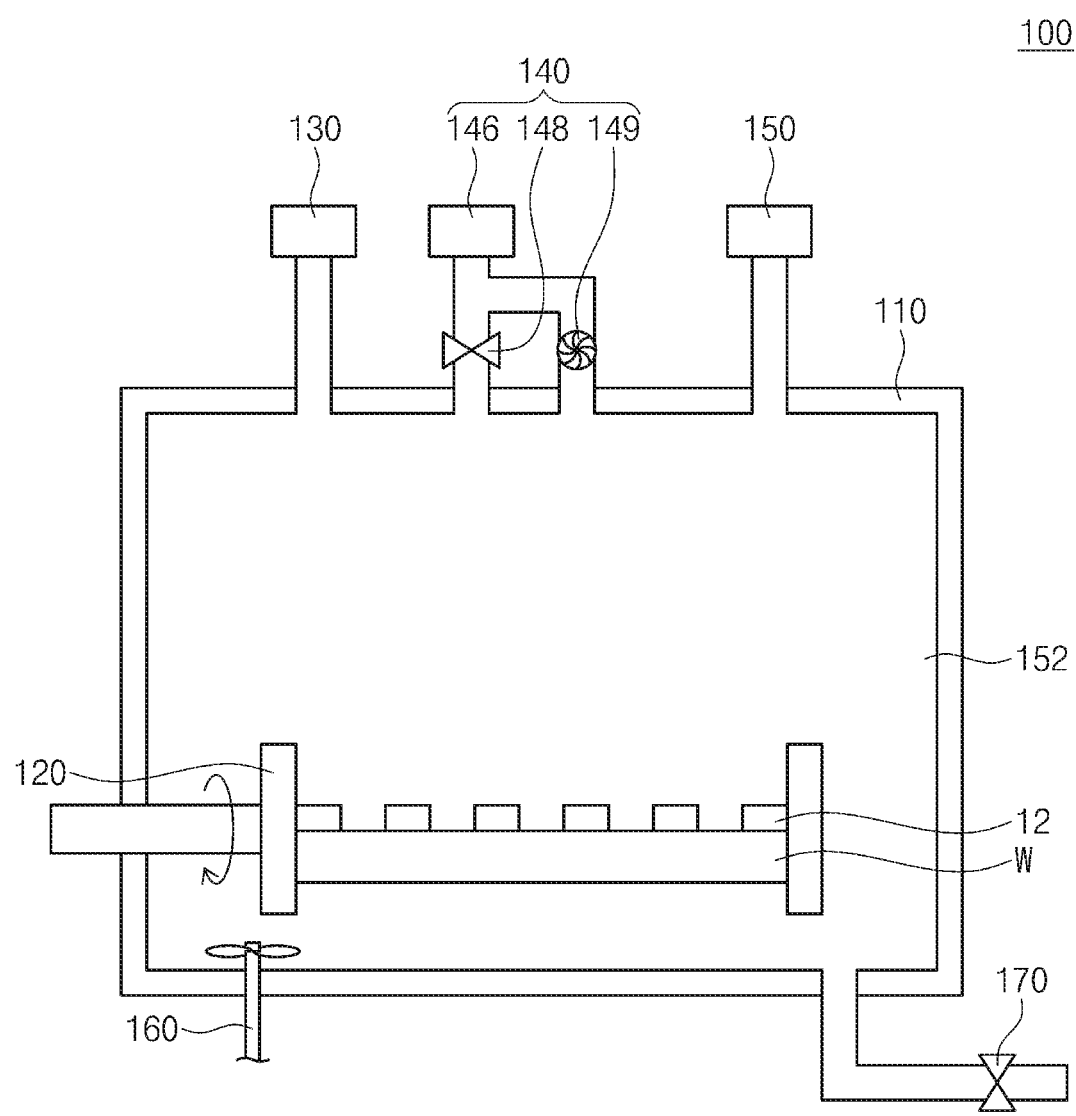

Referring to FIGS. 8 and 15, the cassette 120 may reinvert the substrate W (in S400). The photoresist pattern 12 may be located on the substrate W facing up. Thereafter, a robot arm (not shown) may be used to unload the substrate W from the chamber 110, and during the unloading of the substrate W, a bottom surface of the substrate W may be supported by the robot arm.

Although not shown, in the case where an organic solvent is provided on the substrate W and the photoresist pattern 12, the reinverting of the substrate W (in S400) may be omitted.

Hereinafter, a developing method to be performed on the negative-type photoresist 10 will be described.

Figure 17:
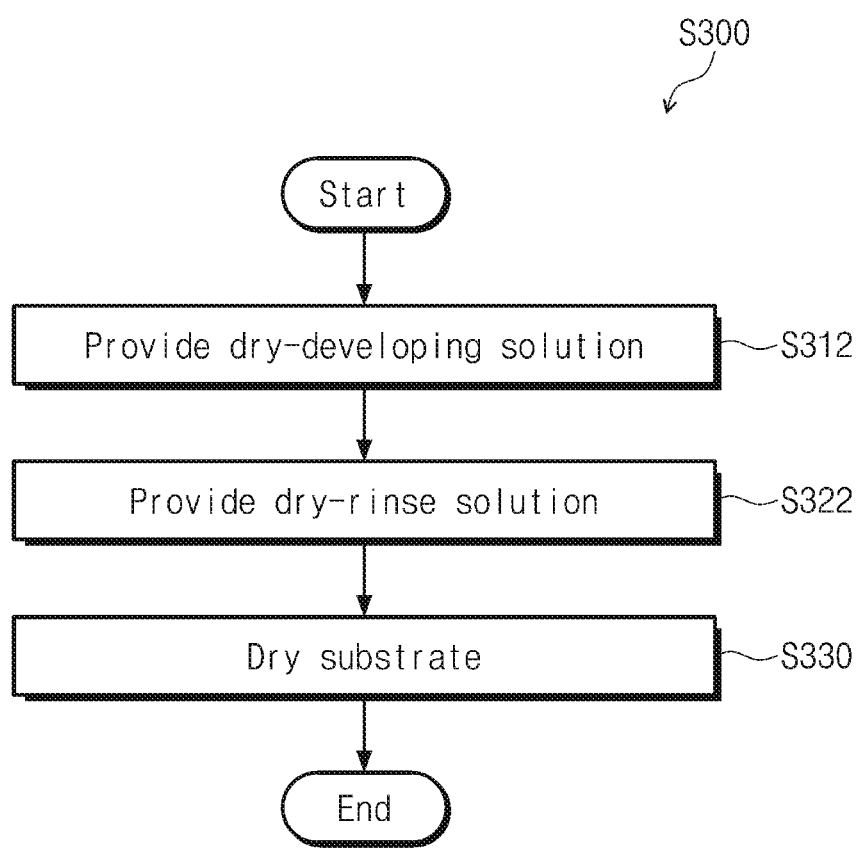
FIG. 17 is a flow chart showing an example of the photoresist developing operation illustrated in FIG. 3.

FIG. 17 shows a flow chart showing an example of the photoresist developing operation illustrated in FIG. 3.

Referring to FIG. 17, in the case where the photoresist 10 is a negative-type photoresist, the developing operation (in S300) may include a negative tone developing method. As an example, the photoresist developing operation (in S300) may include providing a dry-developing solution (in S312), providing a dry-rinse solution (in S322), and drying the substrate W (in S330).

Figure 18:
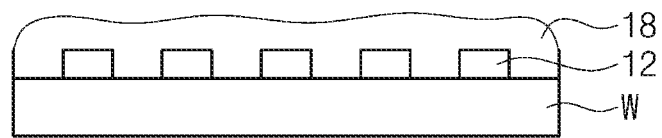
FIGS. 18 to 20 are cross-sectional views illustrating the operations illustrated in FIG. 17.
Figure 19:
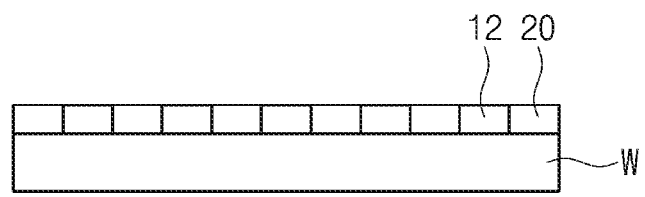
Figure 20:
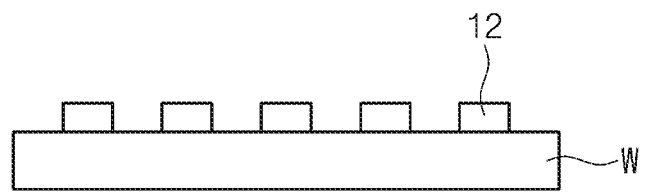

FIGS. 18 to 20 are cross-sectional views illustrating the operations illustrated in FIG. 17.

Referring to FIGS. 17 and 18, a dry-developing solution 18 may be provided on the substrate W (in S312). The dry-developing solution 18 may remove the non-exposure region 17 of the photoresist 10, and thus, the exposure region 15 may be used as the photoresist pattern 12. The dry-developing solution 18 may include a nonpolar solvent (e.g., an organic solvent), but the inventive concepts are not limited to this example.

Referring to FIGS. 17 and 19, a dry-type rinse solution 20 may be provided on the substrate W to remove the dry-developing solution 18 (in S322). The dry-rinse solution 20 may include normal-butyl acetate, but the inventive concepts are not limited to this example.

Referring to FIGS. 17 and 20, the substrate W may be dried (in S330).

Figure 21:
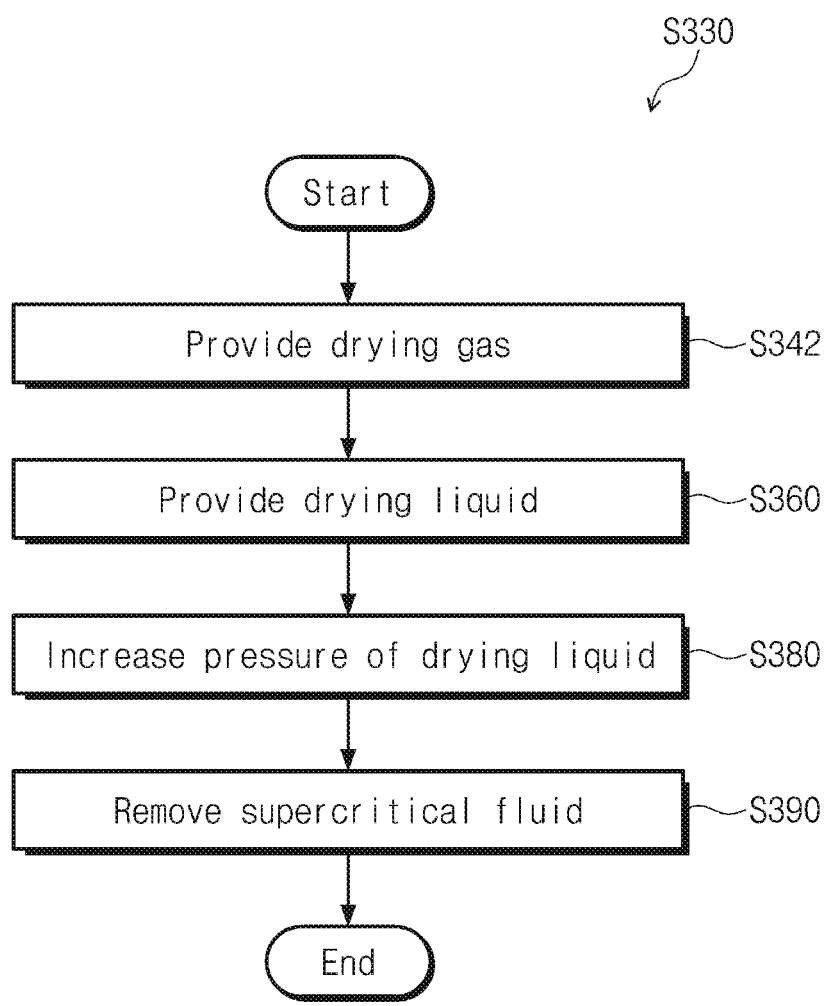
FIG. 21 is a flow chart illustrating an example of a substrate drying operation in FIG. 20.

FIG. 21 illustrates an example of the substrate drying operation (in S330) in FIG. 20.

Referring to FIG. 21, the substrate drying operation (in S330) may include providing the drying gas 152 (in S342), providing the drying liquid 142 (in S360), increasing a pressure of the drying liquid 142 to produce the supercritical fluid 144 (in S380), and removing the supercritical fluid 144 (in S390).

FIGS. 22 to 25 are diagrams illustrating the substrate drying operation (in S330) in FIG. 20.

Figure 22:
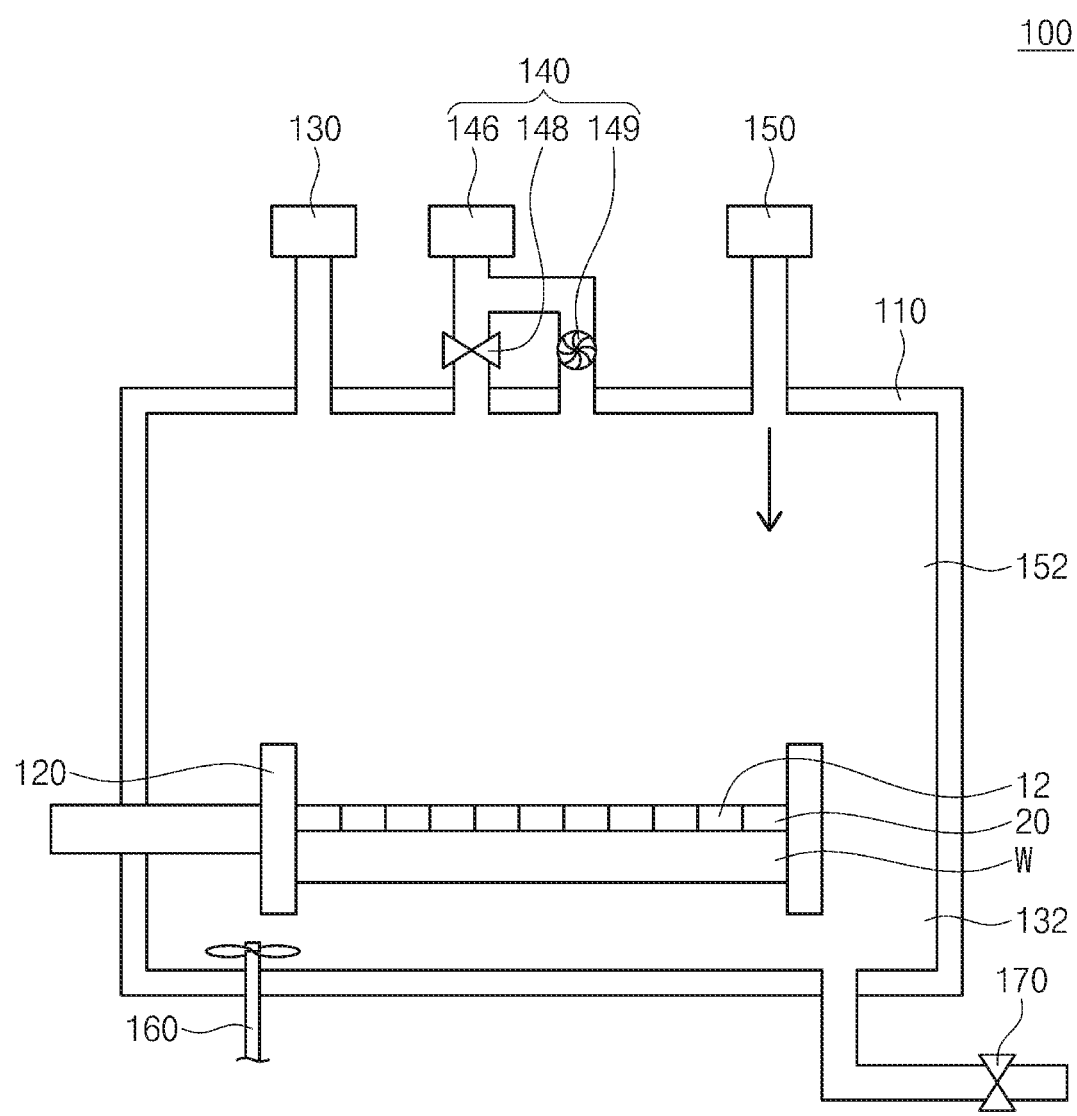
FIGS. 22 to 25 are diagrams illustrating a substrate drying operation in FIG. 20.

Referring to FIGS. 21 and 22, the gas supplier 150 may supply the drying gas 152 into the chamber 110 (in S342). The drying gas 152 may include a carbon dioxide ($CO_2$) gas. The drying gas 152 in the chamber 110 may have a pressure that is higher than the triple point 143 and is lower than the critical point 141. For example, the drying gas 152 may have a pressure of about 5.2 bar or higher.

Figure 23:
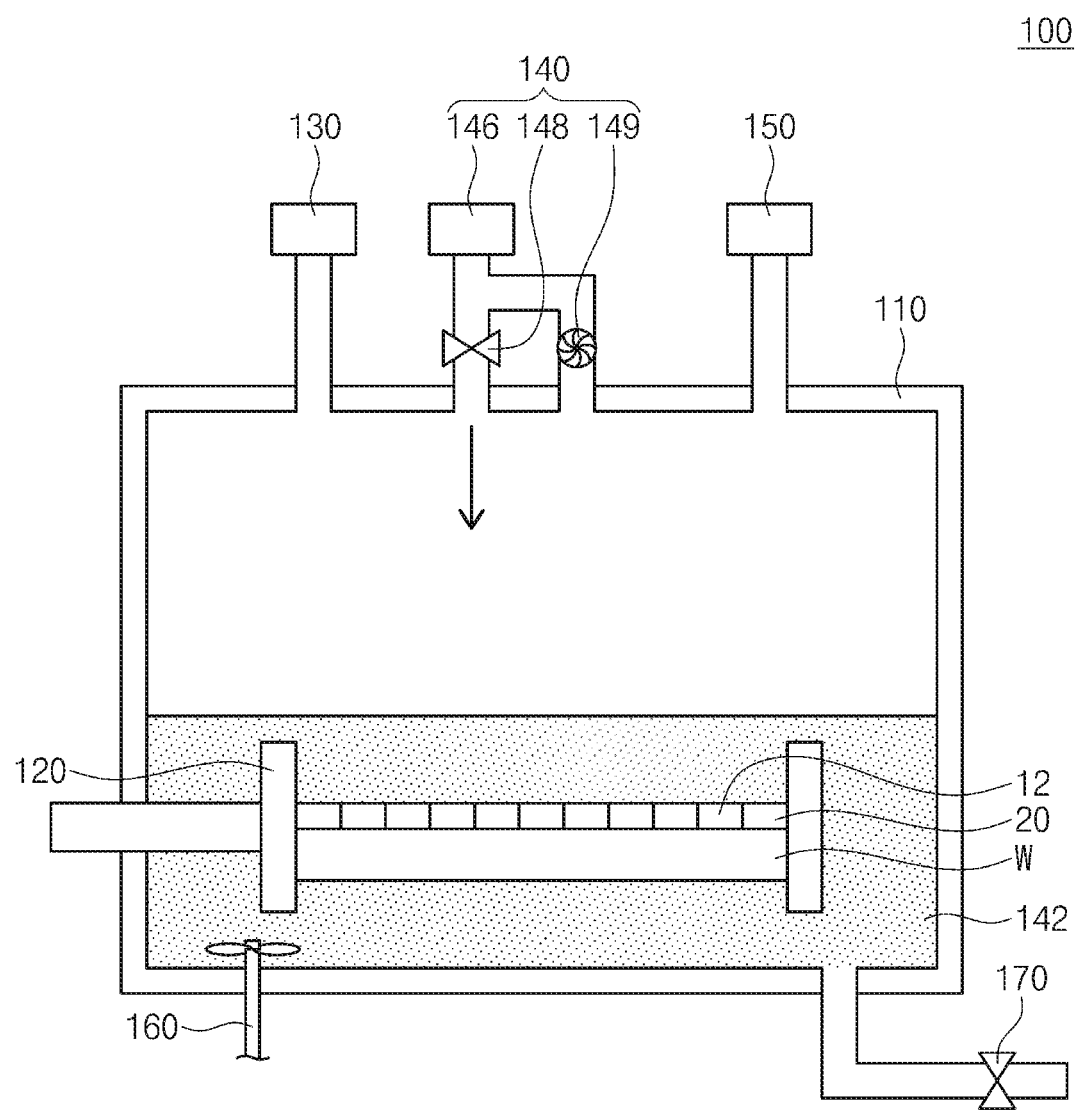

Referring to FIGS. 21 and 23, the second solution supplier 140 may provide the drying liquid 142 on the substrate W (in S360). The drying liquid 142 may include liquid carbon dioxide. The drying liquid 142 may be mixed with the dry-rinse solution 20.

Although not shown, the exhaust 170 may exhaust a portion of the drying liquid 142 and the dry-rinse solution 20, and the second solution supplier 140 may additionally supply the drying liquid 142 through the valve 148 to decrease the concentration of the dry-rinse solution 20 in the drying liquid 142.

Figure 24:
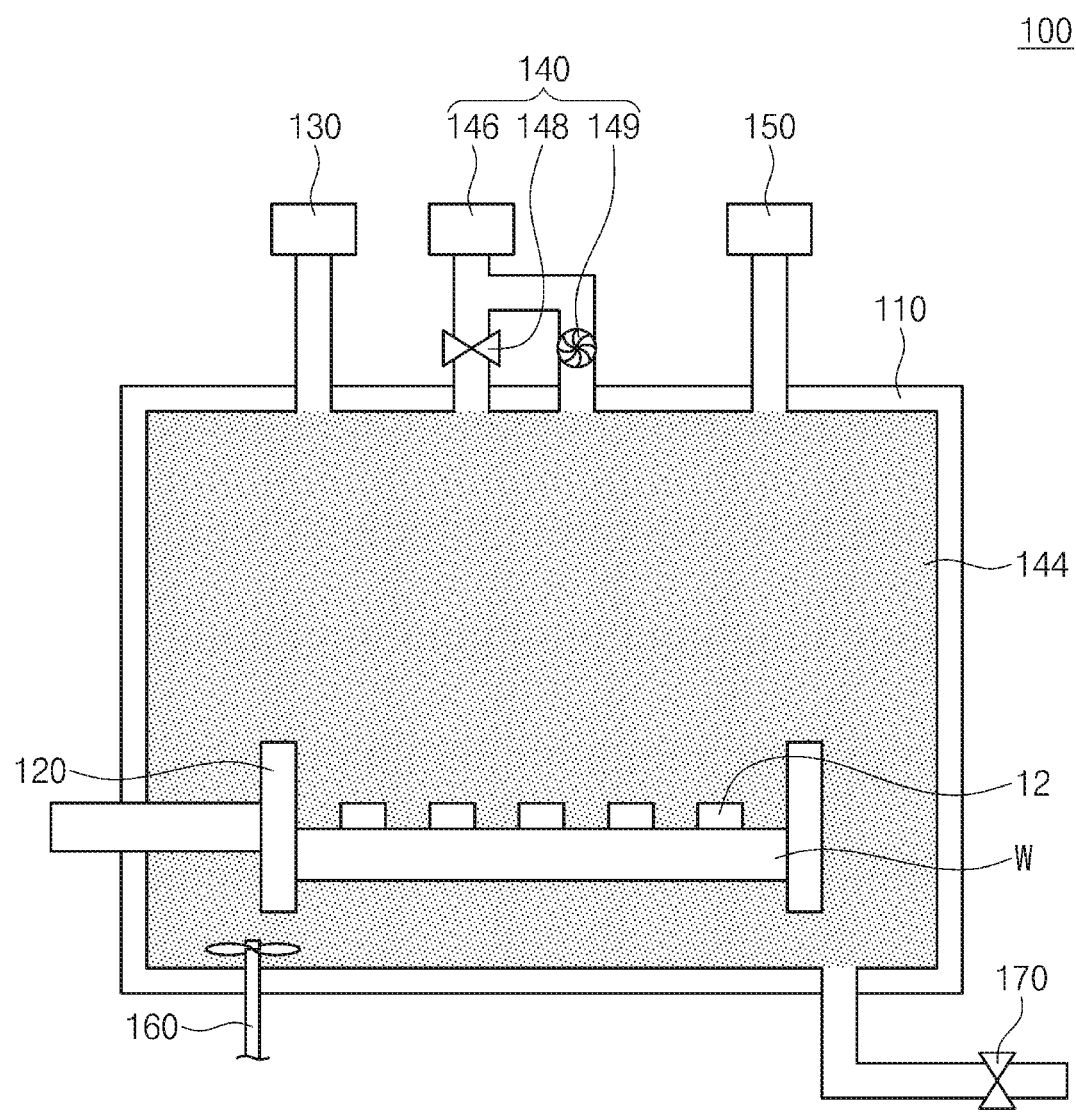

Referring to FIGS. 21 and 24, the pump 149 of the second solution supplier 140 may increase the pressure of the drying liquid 142 to produce the supercritical fluid 144 (in S380). The pressure of the drying liquid 142 may be increased to a value higher than the critical point 141, and in this case, the drying liquid 142 may be changed to the supercritical fluid 144. If the pressure of the dry-rinse solution 20 is increased to a value higher than that of the critical point 141, the dry-rinse solution 20 may be changed to the supercritical fluid 144. For example, at a pressure of about 70 bar or lower, the dry-rinse solution 20 may be changed to the supercritical fluid 144.

Figure 25:
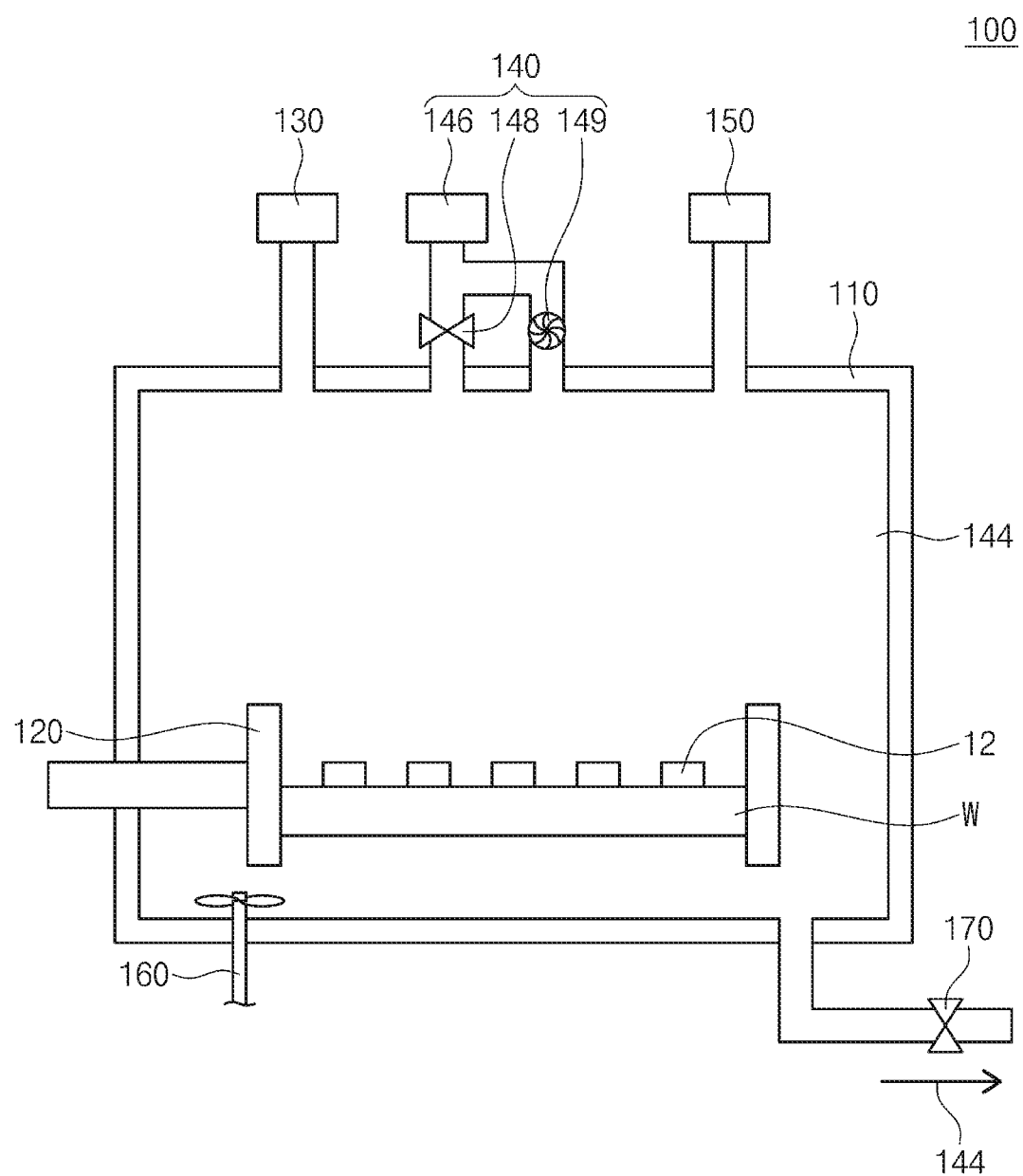

Referring to FIGS. 21 and 25, the exhaust 170 may exhaust the supercritical fluid 144 (in S390). Because the surface tension of the supercritical fluid 144 is substantially zero, the photoresist pattern 12 may be dried, without the leaning defects caused by the surface tension.

Thereafter, the robot arm may be used to unload the substrate W from the chamber 110, and during the unloading of the substrate W, a bottom surface of the substrate W may be supported by the robot arm.

According to an example embodiment of the inventive concepts, a substrate drying method may include replacing a rinse solution on a substrate with a supercritical fluid of a drying liquid, thereby preventing or reducing leaning defects of a photoresist pattern.

While some example embodiments of the inventive concepts have been particularly shown and described, it will be understood by one of ordinary skill in the art that variations in form and detail may be made therein without departing from the spirit and scope of the attached claims.

What is claimed is:

1. A substrate drying method comprising:
    providing a substrate on a cassette in a chamber, the substrate including an top surface having photoresist patterns;
    providing a wetting liquid in the chamber so that the photoresist patterns are dipped in the wetting liquid;
    inverting the substrate in the wetting liquid by rotating the cassette so that the photoresist patterns face a bottom portion of the chamber;
    providing a drying liquid in the chamber such that the drying liquid has a density lower than that of the wetting liquid and is provided on the wetting liquid;
    selectively exhausting the wetting liquid in the chamber through the bottom portion of the chamber to replace the wetting liquid between the photoresist patterns with dry liquid;
    increasing a pressure of the drying liquid in the chamber to produce a supercritical fluid;
    removing the supercritical fluid in the chamber to dry the substrate; and
    inverting the substrate in the chamber by rotating the cassette so that the photoresist patterns face a top portion of the chamber.

2. The method of claim 1, further comprising:
    reinverting the substrate after the removing the supercritical fluid.

3. The method of claim 1, wherein the wetting liquid has a density higher than a density of the drying liquid.

4. The method of claim 1, wherein the wetting liquid includes deionized water.

5. The method of claim 1, wherein
    the drying liquid includes liquid carbon dioxide, and
    the supercritical fluid includes supercritical carbon dioxide.

6. The method of claim 1, further comprising:
    providing a drying gas on the substrate.

7. The method of claim 6, wherein the drying gas includes a carbon dioxide gas.

8. A developing method comprising:
    providing a developing solution on a substrate;
    providing a rinse solution on the substrate to remove the developing solution; and
    drying the substrate by removing the rinse solution, wherein the drying the substrate includes,
provide the substrate on a cassette in a chamber, the substrate including an top surface having photoresist patterns,
providing a wetting liquid in the chamber so that the photoresist patterns are dipped in the wetting liquid,
inverting the substrate in the wetting liquid by rotating the cassette so that the photoresist patterns face a bottom portion of the chamber,
providing a drying liquid the chamber such that the drying liquid has a density lower than that of the wetting liquid and is provided on the wetting liquid,
selectively exhausting the wetting liquid in the chamber through the bottom portion of the chamber to replace the wetting liquid between the photoresist patterns with the dry liquid,
increasing a pressure of the drying liquid in the chamber to produce a supercritical fluid,
removing the supercritical fluid in the chamber to dry the substrate, and
inverting the substrate in the chamber by rotating the cassette so that the photoresist patterns face a top portion of the chamber.

9. The method of claim 8, wherein
the developing solution includes TetraMethyl-Ammonium-Hydroxide (TMAH), and
the rinse solution includes deionized water.

10. The method of claim 9, wherein
the wetting liquid includes a same material as the rinse solution.

11. The method of claim 8, wherein
the developing solution includes a nonpolar solvent, and
the rinse solution includes acetic acid.

12. The method of claim 8, wherein the drying the substrate further comprises providing a drying gas on the substrate, and a pressure of the drying gas is higher than that of a triple point of the drying gas.

13. A photolithography method, comprising:
forming a photoresist on a substrate;
exposing a portion of the photoresist to light; and
developing the photoresist to form photoresist patterns on the substrate,
wherein the developing the photoresist includes,
providing a developing solution on the substrate,
providing a rinse solution on the substrate to remove the developing solution,
providing the substrate on a cassette in a chamber, the substrate including an top surface having the photoresist patterns,
providing a wetting liquid in the chamber so that the photoresist patterns are dipped in the wetting liquid,
inverting the substrate in the wetting liquid by rotating the cassette so that the photoresist patterns face a bottom portion of the chamber, and
drying the substrate by removing the rinse solution, and
wherein the drying the substrate includes,
providing a drying liquid in the chamber such that the drying liquid has a density lower than that of the wetting liquid and is provided on the wetting liquid,
selectively exhausting the wetting liquid in the chamber through the bottom portion of the chamber to replace the wetting liquid between the photoresist patterns with the dry liquid,
increasing a pressure of the drying liquid in the chamber to produce a supercritical fluid,
removing the supercritical fluid in the chamber to dry the substrate, and
inverting the substrate in the chamber by rotating the cassette so that the photoresist patterns face a top portion of the chamber.

14. The method of claim 13, wherein
the photoresist includes a positive-type photoresist, and
the developing solution includes TetraMethyl-Ammonium-Hydroxide (TMAH), and the rinse solution includes deionized water.

15. The method of claim 14, wherein
the wetting liquid includes a same material as the rinse solution, and
the drying the substrate further comprises reinverting the substrate.

16. The method of claim 13, wherein
the photoresist includes a negative-type photoresist,
the developing solution includes a nonpolar solvent, and
the rinse solution includes acetate.

17. The method of claim 13, wherein the light includes an extreme ultraviolet (EUV) beam.

* * * * *